United States Patent [19]

Esaki et al.

[11] 4,348,686
[45] Sep. 7, 1982

[54] MICROWAVE-INFRARED DETECTOR WITH SEMICONDUCTOR SUPERLATTICE REGION

[75] Inventors: Leo Esaki, Chappaqua; George A. Sai-Halasz, Mount Kisco, both of N.Y.

[73] Assignee: The United States of America as represented by the Secretary of the Army, Washington, D.C.

[21] Appl. No.: 172,794

[22] Filed: Jul. 28, 1980

[51] Int. Cl.³ .............................................. H01L 27/14
[52] U.S. Cl. ........................................ 357/30; 357/4; 357/16
[58] Field of Search .............................. 357/30, 4, 16

[56] References Cited

U.S. PATENT DOCUMENTS

| | | | |
|---|---|---|---|
| 3,626,257 | 12/1971 | Esaki et al. | 317/234 R |
| 3,626,328 | 12/1971 | Esaki et al. | 331/107 G |
| 4,088,515 | 5/1978 | Blakeslee et al. | 148/175 |
| 4,103,312 | 7/1978 | Chang et al. | 357/16 |
| 4,137,542 | 1/1979 | Chang et al. | 357/16 |
| 4,163,238 | 7/1979 | Esaki et al. | 357/17 |

OTHER PUBLICATIONS

Chin-An Chang, R. Ludeke, L. L. Chang, and L. Esaki, "Molecular-Beam Epitaxy (MBE) of $In_{1-x}Ga_xAs$ and $GaSb_{1-y}As_y$," *Applied Physics Letters*, vol. 31, No. 11, Dec. 1, 1977, pp. 759-761.

*Primary Examiner*—Martin H. Edlow
*Assistant Examiner*—J. Carroll
*Attorney, Agent, or Firm*—Nathan Edelberg; Jeremiah G. Murray; Anne V. Dougherty

[57] ABSTRACT

A detector and/or mixer of electromagnetic energy in the microwave-infrared region of the electromagnetic spectrum comprised of a body of semiconductor material having a superlattice region consisting of, for example, InAs - GaSb wherein the thickness of alternating epitaxial planar layers is in the range of 30Å to 80Å. Incident radiation perpendicular to the planar regions results in an electric field being provided in the plane of the layers which causes a reduction in the superlattice bandwidth and accordingly an increase in the transverse effective mass of the carriers. This results in a decrease in the perpendicular conductivity through the superlattice region.

10 Claims, 2 Drawing Figures

MICROWAVE-INFRARED DETECTOR WITH SEMICONDUCTOR SUPERLATTICE REGION

The invention described herein may be manufactured and used by or for the Government for governmental purposes without the payment of any royalties thereon or therefor.

BACKGROUND OF THE INVENTION

This invention relates to semiconductor devices including a periodic structure known as a superlattice and more particularly to such a device which is adapted to operate as a detector and/or mixer of incident microwave and infrared radiation.

Semiconductor devices having a superlattice structure in which there is a periodic variation in semiconductor composition is known having been shown and described, for example, in U.S. Pat. Nos. 3,626,257 and 3,626,328 issuing to Leo Esaki, et al. on Dec. 7, 1971. The teachings of these patents are herein incorporated by reference. The layered superlattice structure is formed by either doping or alloying techniques. In doping the superlattice structure is reduced by epitaxially growing a semiconductor material which is periodically doped so as to produce alternating multi-thin layers having different conductivity types. The alternate technique of alloying involves growing ultra-thin layers with varying alloy compositions. Suitable combinations of semiconductor material for the construction of the thin periodic layers include, for example, GaAs-AlAs, GaSb-AlSb, InAs-GaSb, GaAs-ZnSe, GaSb-ZnTe, InSb-CdTe and their respective alloys.

Sensitive and fast semiconductor detectors and/or mixers in the microwave and infrared (IR) regions of the electromagnetic spectrum are presently of great technological importance. In these devices various physical phenomena are exploited so that the incident radiation modulates some easily measurable parameter of the detector. Most common are the detectors where the conductivity of the device is monitored and in all cases, the radiation results in an increase in the conductivity due to carrier heating. Typically these devices contain shallow traps and have to be cooled in order to freeze out the carriers. The radiation excites the carriers out of these traps, thus creating a surge in conductivity. To date a great deal of effort has been expended to understand the scientific aspects and to perfect the technology of these devices; however, the problems in efficient microwave and IR detection remain numerous. The cooling requirements (often helium temperature operation is necessary) are cumbersome; the response time is unsatisfactory because carriers have to be retrapped which is a typically slow process; and the bandwidth of most of these devices is limited.

This invention is directed to a detector/mixer based on an entirely different effect which results in overcoming the above mentioned fundamental limitations.

It is an object of the present invention, therefore, to provide a superlattice structure which is operable over a relatively wide frequency band.

It is another object of the present invention to provide an improved superlattice structure which is responsive to microwave and infrared radiation.

Yet another object of the present invention is to provide a superlattice structure which is operable at room temperature.

Still another object of the present invention is to provide a superlattice structure which does not have a requirement that the device be cooled for proper operation.

Still another object of the present invention is to provide a superlattice structure which is relatively conductive in the absence of radiation, but becomes relatively less conductive in the presence of radiation.

BRIEF SUMMARY OF THE INVENTION

These and other objects of the invention are provided in accordance with a semiconductor body having a superlattice region wherein the thickness of the alternating epitaxial planar layers is in the range of 30 Å to 80 Å and preferably comprising an indium arsenide (InAs)-gallium antimonide (GaSb) superlattice structure wherein the layer thickness is substantially 60 Å. Contact means are applied for detecting current flow in the perpendicular direction relative to the planar layers. Incident energy is applied perpendicular to the planar layers with a resulting electric field being provided in the plane of the lattice which causes a reduction in the bandwidth and accordingly an increase of the transverse effective mass of the carriers. As a result, conductivity perpendicular to the planar layers decreases in response to incident radiation, thereby providing a means for detecting said radiation.

DESCRIPTION OF THE PREFERRED EMBODIMENT

In a publication entitled "Molecular-Beam Epitaxy (MBE) of $In_{1-x}Ga_xAs$ and $GaSb_{1-y}As_y$," by C. Chang, et al. which appeared in *Applied Physics Letters*, Volume 31, No. 11, Dec. 1, 1977 at pages 759–761 there is disclosed the experimental conditions and the growth characteristics for films of $In_{1-x}Ga_xAs$ and $GaSb_{1-y}As_y$ being grown on gallium arsenide, indium arsenide and gallium antimonide substrates by the technique of molecular beam epitaxy. It is to this type of semiconductor material that finds application in the present invention.

Figure 1:
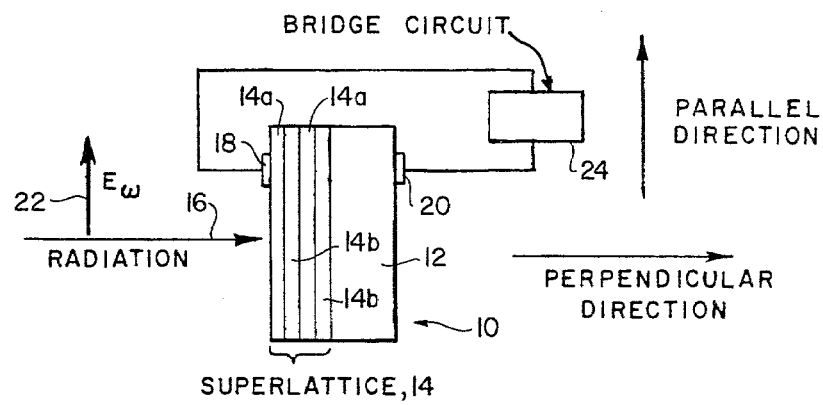
FIG. 1 is illustrative of a semiconductor superlattice device implementing the subject invention.

Referring now to FIG. 1, reference numeral 10 denotes a semiconductor body which includes a substrate 12 on which is formed a superlattice structure 14 consisting of a plurality of alternating planar layers 14a and 14b of first and second type of semiconductor material. Typically as noted above, the materials for the first and second type semiconductor material comprises $In_{1-x}Ga_xAs$ and $GaAs_ySb_{1-y}$ respectively where x and y have values ranging between 1 and 0 but preferably where x and y=0 which results simply in InAs-GaSb. One pair of contiguous layers 14a and 14b define a spatial period which in the present invention optimally is in the vicinity of 120 Å with the individual layers having a thickness in the order of 60 Å each. However, a contemplated range of thicknesses for the individual layers 14a and 14b is 30 Å to 80 Å. The dimension of the individual planar layers of regions is significant and the operating characteristics of the device depend on layers having thicknesses of this magnitude.

When the parameters of the superlattice layers 14a and 14b are chosen to have thicknesses in the range between 30 Å and 80 Å, incident radiation directed normal to the planar regions hereinafter referred to as a perpendicular direction, will cause a decrease in the perpendicular conductivity. Accordingly, as shown in FIG. 1, means, not shown, is adapted to apply a beam 16 of incident electromagnetic radiation to the first planar layer 14a. In order that current conduction in the perpendicular direction across the lattice 14 can be sensed, a pair of electrodes 18 and 20 are applied on the front and back of the device contiguous with the first planar region 14a and the substrate 12. The contact 18 on the front of the device at least is offset so as to not obstruct the incident radiation. When desirable transparent electrodes are utilized to obviate the obstruction. Whereas prior art devices are relatively non-conductive in the absence of light and thereafter becoming conductive when light energy is directed thereto, the present invention due to the existence of the relatively thin layers 14a and 14b making up the superlattice 14 and the material constituency operates in a completely reverse manner in that it is very conductive in the absence of light but becomes less conductive when light is applied to the perpendicular direction. This results from the nature of carrier transport perpendicular to the layers 14a and 14b in response to the electric field $E_\omega$ 22 which accompanies the beam of incident radiation 16 but which is at right angles or transverse to it.

As is well known for the narrow bands existing in a superlattice structure, the effective mass and thus the mobility of the carriers is inversely proportional to the bandwidth, i.e. $m_e \alpha 1/\Delta E$. At the same time, the bandwidth is a function of the parallel momentum of the carriers. This dependence arises due to the fact that when the carriers tunnel through a plurality of alternating layers 14a and 14b of different materials, total energy as well as parallel momentum has to be conserved. Thus an increase in the parallel momentum which exists in the plane of the respective layers will have the effect of making the barriers more difficult to penetrate and thereby causing a reduction in the bandwidth. Accordingly, by applying incident radiation in the perpendicular direction, the electric field $E_\omega$ which is incident to the superlattice in the parallel direction causes an increase in the parallel direction momentum of the carriers which is accompanied by a reduction in the mobility of the same carriers in the perpendicular direction. This characteristic is shown by the graph set forth in FIG. 2. What FIG. 2 specifically illustrates is that for an increase in the carrier energy $E_\parallel$ due to the incident field $E_\omega$ the first sub-band bandwidth decreases, particularly for an InAs-GaSb superlattice 14 where both the layers 14a and 14b each have a thickness of 60 Å.

Since the device 10 in the absence of radiation is conductive, for detection purposes it is desirable to incorporate the device into a circuit 24 shown in FIG. 1 so as to form one element of a bridge measuring circuit. Since carrier heating in the parallel direction occurs when the radiation propagates perpendicularly to the superlattice region 14, no sophisticated radiation channeling is required. The effect as described above and shown in FIG. 2 is substantially linear for relatively low levels of incident radiation; however, at higher power levels, certain non-linearities have been found to exist in the superlattice conduction as well as in the bandwidth reduction with carrier temperature.

As indicated, a InAs-GaSb superlattice configuration is presently considered to be the preferred material in the range of the first conduction band sub-band mainly because carrier heating is proportional to the square of the mobility and InAs has a relatively high carrier mobility. As a result, for a 60 Å InAs-60 Å GaSb superlattice configuration, up to 40% reduction in bandwidth and thus mobility is easily attainable. Since the described effect, namely the reduction in tunneling current with increased parallel momentum is quite general in principle, any tunneling device can be used for the described detection or mixing scheme.

Figure 2:
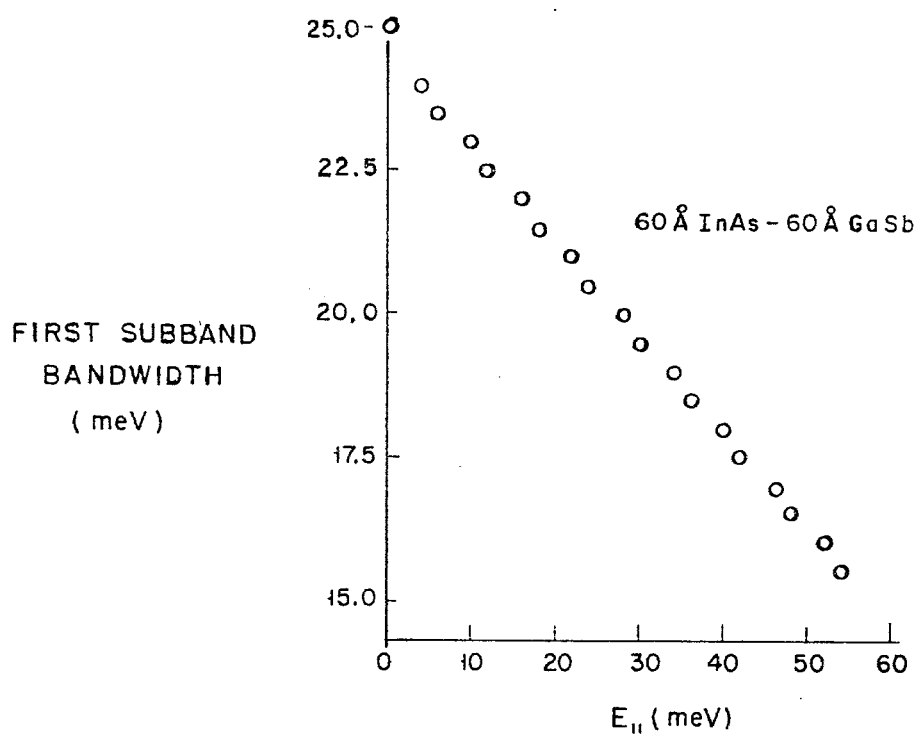
FIG. 2 is a graph which is intended to be helpful in understanding the operation of the subject invention.

Advantages of a device such as shown with respect to FIGS. 1 and 2 are numerous. For example, no cooling is required since no carrier freeze out is involved. It has an extremely fast response time in the order of carrier cooling rates and/or superlattice frequency response well beyond the THz range. It is to be noted that the response of the subject device is broadband due to the fact that it relies solely on carrier heating. Accordingly, the lower frequency limit is DC, while the upper limit is in the order of the onset of the subband absorption, i.e. $2.5 \times 10^{13}$ Hz. This latter figure depends on the type of configuration of the superlattice but in any case is in the order of 0.1 eV which designates the infrared region of the electromagnetic spectrum and thus is adapted to be used as an IR detector.

The degree of bandwidthh reduction with parallel momentum depends on how much the dispersion of the neighboring materials is mismatched in the energy range of the sub-band which is involved in the transport. The thickness of the superlattice layers must be chosen such that an increase in the parallel direction mobility is reflected in a reduced bandwidth which accordingly is accompanied by a decrease in carrier current in the perpendicular direction. Also the selection of constituent material for the superlattice must be selectively chosen to have relatively good mobility in the parallel direction. InAs-GaSb specifically meets these requirements and thus at present is considered to be the preformed material.

While the invention has been particularly shown and described with reference to a preferred embodiment thereof, it is to be understood that the foregoing and other changes in form and details may be made therein without departing from the spirit and scope of the invention.

What is claimed is:

1. A semiconductor device adapted for operation as a detector and/or mixer of electromagnetic radiation and whose operating range extends from DC into the infrared region of the electromagnetic spectrum, comprising:

a body of semiconductor material including a superlattice region having two different materials arranged alternately in a plurality of parallel planar layers, said planar layers having a respective predetermined relatively thin thickness dimension of a value wherein an impinging electric field parallel to said planar layer increases the carrier energy in the plane of said layers to the extent that the perpendicular carrier mobility transverse to the plane of said layers is affected and reduced thereby;

electrode means on said body of semiconductor material for sensing current resulting from said perpendicular carrier mobility in response to incident radiation; and means for directing incident radition on said superlattice structure in a direction perpendicular to said parallel planar layers whereby an accompanying transverse electric field is applied in a direction parallel to said planar layers.

2. The semiconductor device as defined by claim 1 wherein said thickness dimension of said planar layers have respective values ranging from between 30 Å and 80 Å.

3. The semiconductor device as defined by claim 2 wherein the thickness dimension of all said parallel planar layers is of substantially the same value.

4. The semiconductor device as defined by claim 3 wherein said thickness dimension of said plurality of planar layers is in the vicinity of 60 Å and wherein said superlattice region is comprised of $In_{1-x}Ga_xAs$-$GaAs_ySb_{1-y}$ wherein x and y have respective values which lie between 0 and 1.

5. The semiconductor device as defined by claim 1 wherein said superlattice region is a structure comprised of $In_{1-x}Ga_xAs$-$GaAs_ySb_{1-y}$ wherein x and y have respective values which lie between 0 and 1.

6. The semiconductor device as defined by claim 5 wherein x and y are equal to 0.

7. The semiconductor device as defined by claim 5 wherein said thickness dimensions of said planar layers have values in a range which varies from the vicinity of 30 Å to the vicinity of 80 Å.

8. The semiconductor device as defined by claim 7 wherein said thickness dimension of said parallel layers are substantially equal.

9. The semiconductor device as defined by claim 8 wherein said thickness dimension of said parallel planar layers is substantially 60 Å.

10. The semiconductor device as defined by claim 1 and additionally including a bridge circuit connected to said electrode means whereby said body of semiconductive material forms one element of a bridge measuring circuit.

* * * * *